United States Patent
Beach et al.

(10) Patent No.: US 7,288,803 B2
(45) Date of Patent: Oct. 30, 2007

(54) III-NITRIDE POWER SEMICONDUCTOR DEVICE WITH A CURRENT SENSE ELECTRODE

(75) Inventors: Robert Beach, Altadena, CA (US); Paul Bridger, Altadena, CA (US); Daniel M. Kinzer, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 43 days.

(21) Appl. No.: 11/240,017

(22) Filed: Sep. 30, 2005

(65) Prior Publication Data

US 2006/0081985 A1   Apr. 20, 2006

Related U.S. Application Data

(60) Provisional application No. 60/615,445, filed on Oct. 1, 2004.

(51) Int. Cl.
*H01L 31/00* (2006.01)

(52) U.S. Cl. ............... 257/192; 257/194; 257/287; 257/343

(58) Field of Classification Search ............. 257/192, 257/194, 287, 343
See application file for complete search history.

(56) References Cited

U.S. PATENT DOCUMENTS

2005/0151255 A1   7/2005   Ando et al.
2006/0081985 A1*  4/2006   Beach et al. ............. 257/745

FOREIGN PATENT DOCUMENTS

| JP | 2-40964 | 2/1990 |
| JP | 2003-229439 | 8/2003 |

OTHER PUBLICATIONS

Office Action dated Jan. 4, 2007 from the Japanese Patent Office for the corresponding Japanese Application No. 2005-290361 (translated).

* cited by examiner

*Primary Examiner*—Mark V. Prenty
(74) *Attorney, Agent, or Firm*—Ostrolenk, Faber, Gerb, Soffen, LLP

(57) ABSTRACT

A III-nitride power semiconductor device that includes a current sense electrode.

17 Claims, 5 Drawing Sheets

III-NITRIDE POWER SEMICONDUCTOR DEVICE WITH A CURRENT SENSE ELECTRODE

RELATED APPLICATION

This application is based on and claims the benefit of U.S. Provisional application No. 60/615,445, filed on Oct. 1, 2004, entitled III-Nitride FET with Current Sense, to which a claim of priority is hereby made and the disclosure of which is incorporated by reference, and is related to U.S. patent application Ser. No. 11/056,062 entitled III-Nitride Bidirectional Switch, the disclosure of which is incorporated by reference.

BACKGROUND OF THE INVENTION

The present invention relates to power semiconductor devices and more particularly to III-nitride power semiconductor devices.

A high electron mobility transistor (HEMT) is an example of a conventional power semiconductor device. A HEMT may be formed using a III-nitride-based semiconductor die. Specifically, a HEMT according to the conventionally known art includes a first III-nitride semiconductor body, which may be composed of, for example, undoped GaN, and a second III-Nitride semiconductor body, which may be composed of, for example, AlGaN, disposed over first III-nitride semiconductor body. As is well known, the heterojunction of first III-nitride semiconductor body and second III-nitride semiconductor body results in the formation of a conductive region usually referred to as a two•dimensional electron gas (2DEG).

A typical HEMT further includes at least two power electrodes. The current is conducted through the 2DEG between the two power electrodes.

A HEMT may also include a gate structure which can be operated to disable and enable the 2DEG as desired, thereby turning the device ON or OFF. As a result, a HEMT can be operated like a field effect transistor. Indeed, such a device is generally referred to as a heterojunction field effect transistor (HFET).

Due to their low loss, high current carrying and high breakdown voltage capabilities III-nitride-based heterojunction power semiconductor devices are suitable for power applications. In many such power applications, it is desirable to know the state of the current that is being transmitted through the device. For example, in bridge applications it may be desirable to know the state of current that is being carried in one switch before the other switch in the bridge is turned on in order to, for example, avoid shoot through or other undesirable results. Also, it may be desirable to know the state of the current to ensure that the device is not carrying current beyond its rating to avoid failure or undue power dissipation.

SUMMARY OF THE INVENTION

It is an object of the present invention to provide a III-nitride based power semiconductor device that is configured to have the capability to provide information about the state of the current that is carried therethrough.

A III-nitride power semiconductor device according to the present invention includes a III-nitride heterojunction region, a first power electrode electrically connected to the III-nitride heterojunction region and a first power pad, a second power electrode opposite and spaced from the first power electrode electrically connected to the III-nitride heterojunction region and to a second power pad, and a third power electrode opposite and spaced from the first power electrode electrically connected to the III-nitride heterojunction region and to a third power pad.

According to the present invention the third power electrode and the first power electrode form a small transistor. Thus, the first pad and the third pad may be used to determine the state of the current through the device. For example, a device according to the present invention includes a III-nitride active region, the active region including a plurality of active cells, each cell including at least a source electrode, and a drain electrode each electrically connected to a respective pad, and a current sense finger electrode opposite the drain electrode and electrically connected to a respective current sense pad. The current sense terminal is used in effect as a second source, and the current is drawn from the drain. The current sense terminal is thus held at a bias voltage very close to the source for accurate sensing.

A device according to the first embodiment of the present invention preferably includes a gate structure having a plurality of gate fingers each disposed between a respective first power electrode and a respective second power electrode, as well as at least one gate finger between the first power electrode and the third power electrode. Thus, for example, a device according to the first embodiment includes a III-nitride active region, the active region including a plurality of active cells, each cell including at least a source electrode, and a drain electrode each electrically connected to a respective pad, a current sense electrode arranged opposite the drain electrode and electrically connected to a respective current sense pad, and a gate structure having a plurality of gate fingers each disposed between a source electrode and a drain electrode, and at least one finger disposed between a drain electrode and the current sense electrode.

A device according to the second embodiment of the present invention further includes a second gate structure having gate fingers each disposed between a respective first power electrode and a respective second power electrode, as well as at least one gate finger between the first power electrode and the third power electrode. Thus, for example, a device according to the second embodiment includes a III-nitride active region, the active region including a plurality of active cells, each cell including at least a first source/drain electrode, and a second source/drain electrode each electrically connected to a respective pad, a current sense electrode arranged opposite one of the source/drain electrodes and electrically connected to a respective current sense pad, and at least two gate structures each having a plurality of gate fingers and disposed between a first source/drain electrode and a second source/drain electrode and at least one gate finger from each gate structure disposed between a source/drain electrode and the current sense electrode.

Other features and advantages of the present invention will become apparent from the following description of the invention which refers to the accompanying drawings.

DETAILED DESCRIPTION OF EMBODIMENTS OF THE INVENTION

Figure 1A:
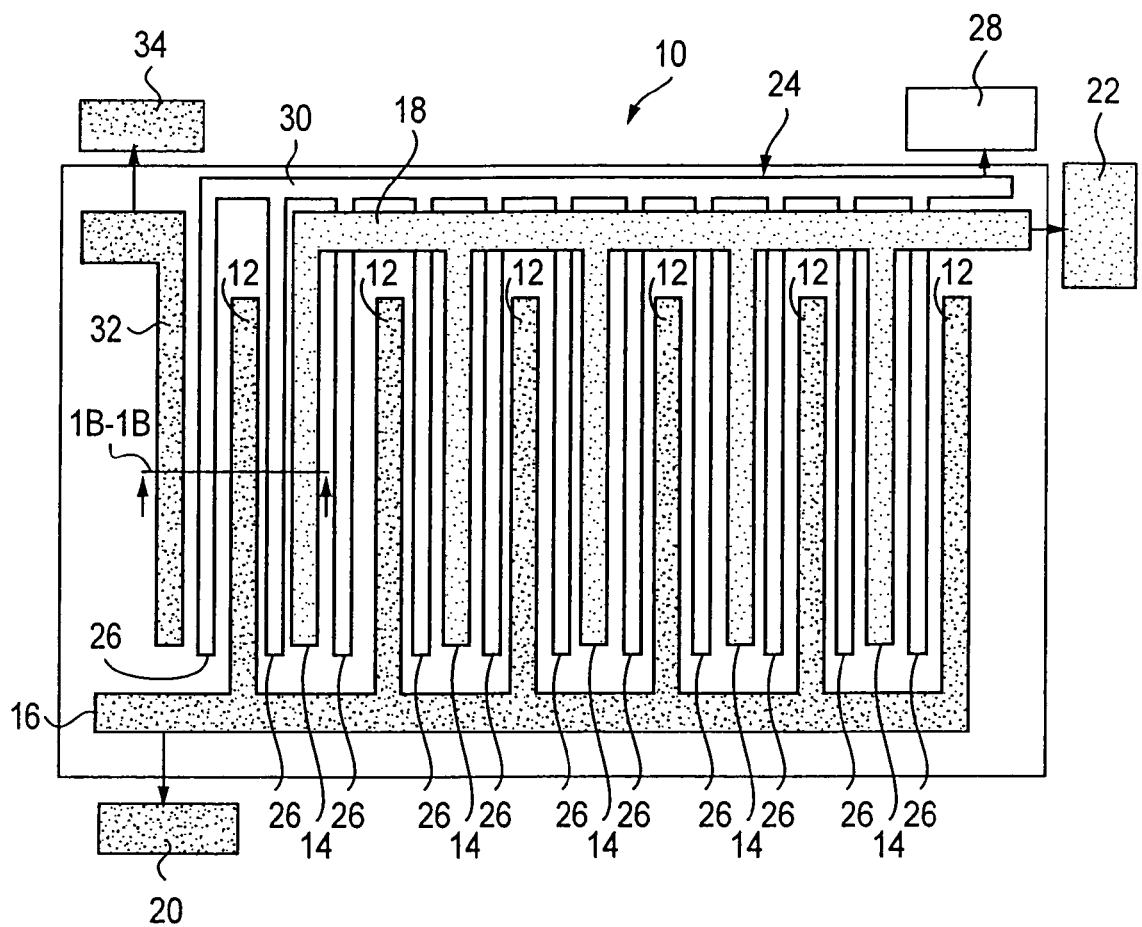
FIG. 1A schematically illustrates a top plan view of an active cell of a power semiconductor device according to the first embodiment of the present invention.
Figure 1B:
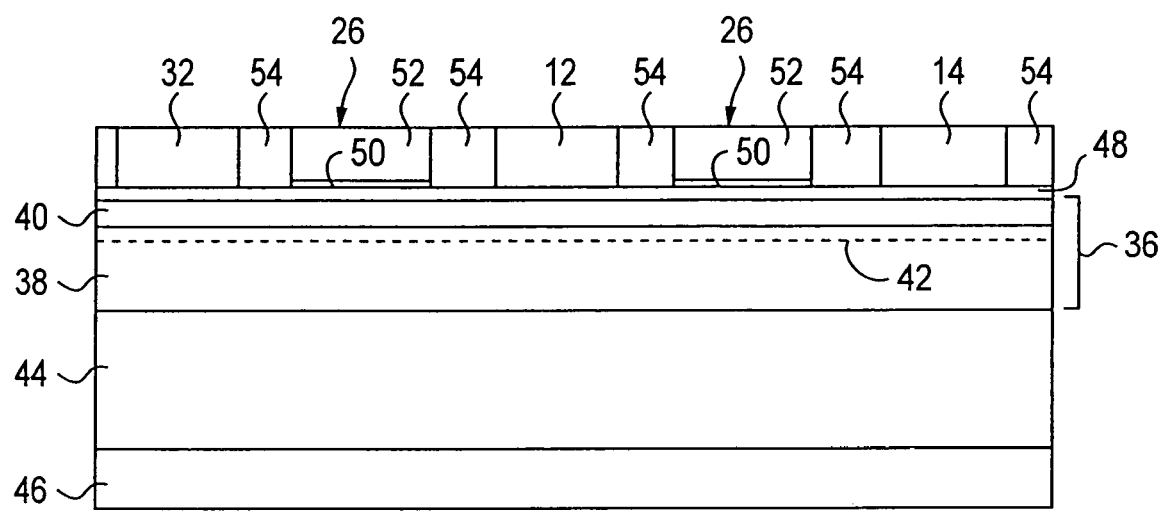
FIG. 1B schematically illustrates a cross-sectional view of the device of FIG. 1A along line 1B-1B viewed in the direction of the arrows.

Referring to FIGS. 1A-1B, a power semiconductor device according to the first embodiment of the present invention is a III-nitride based metal, insulator heterojunction field effect transistor (MISHFET) 10, which includes a plurality of first power electrodes (drain electrodes) 12, and a plurality of second power electrodes (source electrodes) 14 arranged in an interdigitated pattern. Drain electrodes 12 are electrically connected to one another by a respective drain feed 16 and source electrodes 14 are electrically connected to one another by a respective source feed 18. Drain feed 16 is also electrically connected to a first power pad (drain pad) 20 and source feed 18 is electrically connected to a second power pad (source pad) 22. Drain pad 20 and source pad 22 are located somewhere on the die and are used for external power connection.

Device 10 according to the first embodiment further includes a gate structure 24. Gate structure 24 includes a plurality of gate fingers 26 each disposed between a respective drain electrode 12 and source electrode 14. Gate fingers 26 are electrically connected to one another and to gate pad 28 by a common gate feed 30.

According to the present invention, third power electrode (current sense electrode) 32 is disposed opposite a drain electrode 12, a gate finger 26 is disposed between current sense electrode 32 and oppositely disposed drain electrode 12, and current sense electrode 32 is electrically connected to third power pad (current sense pad) 34, which is not electrically connected to any of the other pads of the device. As a result, the device will include a small transistor which can be used to obtain information about the status of the current conducted through the device.

Referring specifically to FIG. 1B, a device 10 according to the first embodiment of the present invention includes a III-nitride heterojunction region 36. III-nitride heterojunction region 36 includes first III-nitride semiconductor body 38 and second III-nitride semiconductor body 40 formed over first III-nitride semiconductor body 38. Each III-nitride semiconductor body 38, 40 is composed of an alloy of InAlGaN selected so that the heterojunction of the two bodies results in a 2DEG 42 as is well known in the art.

Heterojunction 36 is preferably formed over buffer layer 44, which is formed over substrate 46. Each drain electrode 12, each source electrode 14, and current sense electrode 32 are electrically connected to heterojunction 36. For example, in a preferred embodiment, a low resistivity contact layer 48 is disposed over second III-nitride semiconductor body 40, and each electrode 12, 14, 32 is ohmically connected to low resistivity contact layer 48, and thereby electrically connected to heterojunction 48. Alternatively, low resistivity contact layer 48 may be omitted and power electrodes 12, 14, 32 may be ohmically connected to second III-nitride semiconductor body 40 without deviating from the scope and spirit of the present invention.

In a preferred embodiment of the present invention, each gate finger 26 includes a gate insulation 50, and a gate electrode 52 disposed over gate insulation 50. Alternatively, gate fingers 26 may make schottky contact with second III-nitride semiconductor body 40 thereby forming a heterojunction field effect transistor (HFET) without deviating from the scope and the spirit of the present invention.

A preferred embodiment of the present invention may further include a passivation body 54 for the protection of the device.

Figure 2A:
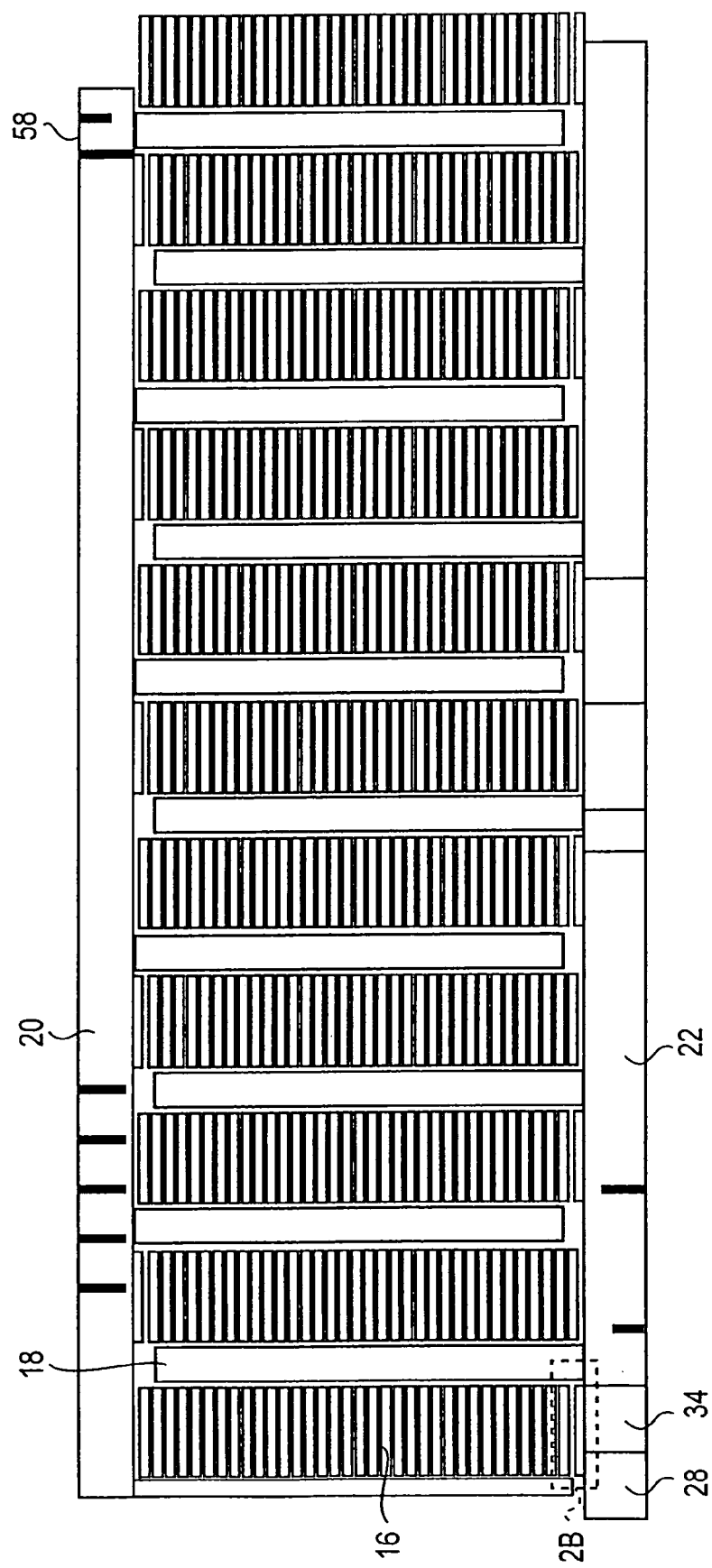
FIG. 2A schematically illustrates a top plan view of a plurality of active cells of a power semiconductor device according to the second embodiment of the present invention.
Figure 2B:
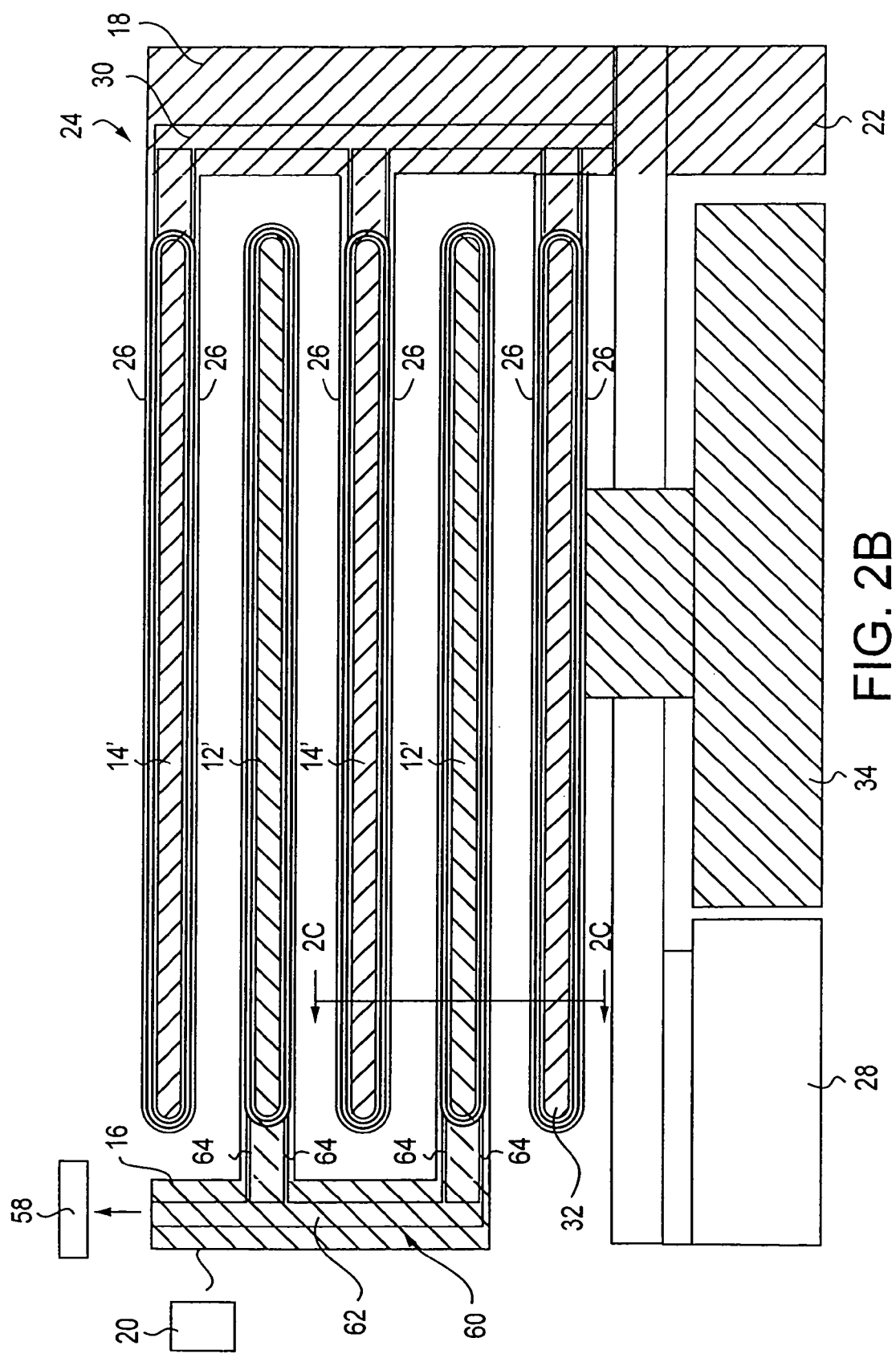
FIG. 2B schematically illustrates an enlarged top plan view of portion 2B (FIG. 2A) of an active cell of a power semiconductor device according to the second embodiment of the present invention.
Figure 2C:
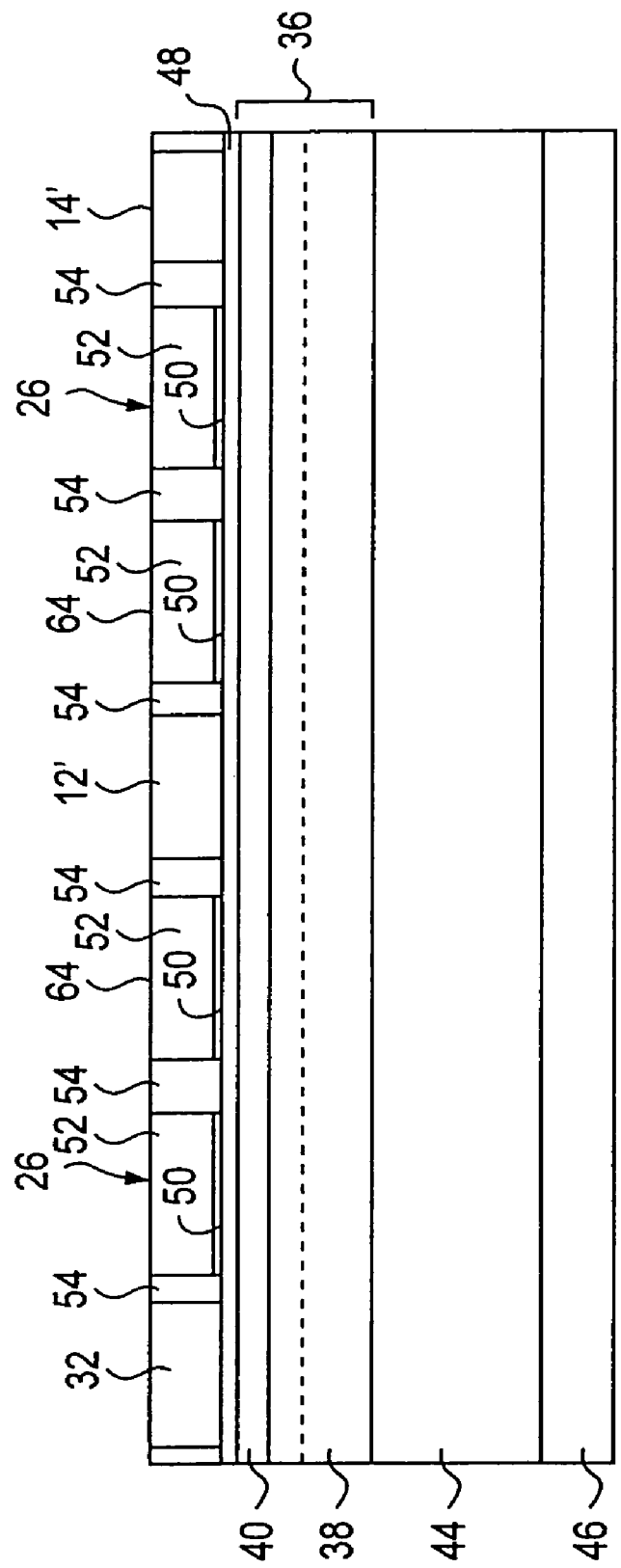
FIG. 2C schematically illustrates a cross-sectional view of a portion of the device of FIG. 2A along line 2C-2C (FIG. 2B) viewed in the direction of the arrows.

Referring next to FIGS. 2A-2C, a power semiconductor device 56 according to the second embodiment of the present invention includes a second gate pad 58 which is electrically connected to a respective second gate structure 60. Second gate structure 60 includes a gate feed 62 and a plurality of second gate fingers 64 each gate finger 64 being disposed between a respective source/drain electrode 12' and source/drain electrode 14'. Device 56 according to the second embodiment is a bidirectional switch. Therefore, each power electrode of a device according to the second embodiment functions as a drain or a source depending on the direction of the bias. A bidirectional device is discussed in detail in U.S. patent application Ser. No. 11/056,062, entitled III-nitride bidirectional switch, assigned to the assignee of the present invention, the contents of which are incorporated herein by reference.

According to the present invention, a device according to the second embodiment includes a current sense electrode 32 disposed opposite a source/drain electrode 12'. A first gate finger 26 and a second gate finger 64 are disposed between current sense electrode 32 and oppositely disposed source/drain electrode 12', thereby forming a small transistor for providing information about the current that is conducted through the device.

In a device according to the present invention, first III-nitride semiconductor body 38 may be composed of GaN, second III-nitride semiconductor body 40 may be composed AlGaN, low resistivity layer 48 may be composed of low resistivity AlGaN, and buffer layer 44 may be composed of AlN. In addition, drain electrodes 12, source electrodes 14, source/drain electrodes 12', 14', and current sense electrode 32 may be composed of any suitable material such as Ti/Al, Ni/Au, Hf, Si, or another Si containing alloy. A suitable material for gate insulation 50 may be $SiO_2$, $Si_3N_4$, or diamond and a suitable material for gate electrode 52 may be Ti/Al, Ni/Au, Hf, Si, or a Si containing alloy. Passivation body 54 may be composed of any protective material such as $SiO_2$ in any of its forms, but is preferably composed of a material that prevents the out diffusion of nitrogen such as a nitrogen rich material. A suitable material for passivation body 54 may be one or more of the following: $SiO_2$ (in any of its forms), AlN, HfN, AlGaN, highly doped GaN, highly doped poly GaN, or LPCVD $Si_3N_4$.

Furthermore, substrate 6 is preferably made from Si, for economic reasons. However, other substrate materials such as SiC, sapphire, or GaAs may be used. It should be noted that buffer layer 8 may be omitted if substrate 6 is composed of a material compatible with first III-nitride semiconductor body 38. For example, substrate 6 may be formed from bulk GaN, or bulk like GaN.

Also, it should be noted that although the preferred embodiments include interdigitated power electrodes, other layouts are also possible for lateral devices. For example, the power electrodes may be arranged in cellular or checkerboard patterns without deviating from the scope and spirit of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A field effect power semiconductor device comprising:
in an active cell thereof;
a III-nitride heterojunction region;
a first power electrode electrically connected to said III-nitride heterojunction region and a first power pad;
a second power electrode opposite and spaced from said first power electrode electrically connected to said III-nitride heterojunction region and to a second power pad; and
a third power electrode opposite and spaced from said first power electrode electrically connected to said III-nitride heterojunction region and to a third power pad;
wherein the device comprises a first gate structure having one finger disposed between said first power electrode and said second power electrode, an another finger disposed between said first power electrode and said third power electrode.

2. The device of claim 1, wherein said gate structure makes schottky contact with said top surface.

3. The device of claim 1, wherein said gate structure includes a gate insulation over said III-nitride heterojunction region and a gate electrode over said gate insulation.

4. The device of claim 3, wherein said gate insulation is comprised of $SiO_2$, or $Si_3N_4$, or diamond.

5. The device of claim 1, wherein a low resistivity contact body is disposed between said power electrodes and said III-nitride heterojunction region.

6. The device of claim 1, wherein said heterojunction includes a first III-nitride semiconductor body comprised of one alloy of InAlGaN, and a second III-nitride semiconductor body comprised of another alloy of InAlGaN.

7. The device of claim 6, wherein said first III-nitride semiconductor body is comprised of GaN, and said second III-nitride semiconductor body is comprised of AlGaN.

8. The device of claim 1, wherein said III-nitride heterojunction region is disposed over a substrate.

9. The device of claim 8, wherein said substrate is comprised of Si, SiC, Sapphire, GaN or GaAs.

10. The device of claim 8, further comprising a buffer layer disposed between said III-nitride heterojunction region and said substrate.

11. The device of claim 10, wherein said buffer layer is comprised of AlN.

12. The device of claim 1, further comprising a second gate structure disposed between said first power electrode and said second power electrode.

13. The device of claim 1, further comprising a first conductive feed electrically connecting said first power electrode to said first power pad, and a second conductive feed electrically connecting said second power electrode to said second power pad.

14. A field effect power semiconductor device comprising:
a III-nitride active region, said active region including a plurality of active cells, each cell including at least a source electrode, and a drain electrode each electrically connected to a respective pad; and
a current sense electrode arranged opposite said drain electrode and electrically connected to a respective current sense pad;
wherein the device comprises a first gate structure disposed between said source electrode and said drain electrode, and said drain electrode and said current sense electrode.

15. A device according to claim 14, wherein said III-nitride active region includes a heterojunction comprised of a first semiconductor body comprising an alloy of InAlGaN, and a second semiconductor body comprising another alloy of InAlGaN.

16. A device according to claim 15, wherein said first semiconductor body is comprised of GaN, and said second semiconductor body is comprised of AlGaN.

17. A device according to claim 14, further comprising a second gate structure disposed between said source electrode and said drain electrode.

* * * * *